United States Patent [19]
Weiss et al.

[11] Patent Number: 6,054,234
[45] Date of Patent: Apr. 25, 2000

[54] BATTERY TESTER LABEL FOR BATTERY

[75] Inventors: Victor H. Weiss; John G. Langbehn, both of Minnetonka; Jeffrey L. Anderson, Excelsior; Dean A. Laird, Shakopee, all of Minn.

[73] Assignee: Morgan Adhesives Company, Stow, Ohio

[21] Appl. No.: 08/979,605

[22] Filed: Nov. 26, 1997

Related U.S. Application Data

[63] Continuation of application No. 08/634,071, Apr. 17, 1996, Pat. No. 5,830,596, which is a continuation-in-part of application No. 08/426,367, Apr. 21, 1995, Pat. No. 5,626,978, which is a continuation of application No. 08/056,157, May 3, 1993, Pat. No. 5,409,788, which is a continuation of application No. 08/377,178, Jan. 24, 1995, Pat. No. 5,538,806, which is a continuation of application No. 08/056,160, May 3, 1993, Pat. No. 5,393,618, which is a continuation of application No. 08/377,352, Jan. 24, 1995, Pat. No. 5,604,049, which is a continuation of application No. 08/056,158, May 3, 1993, Pat. No. 5,389,458.

[51] Int. Cl.$^7$ .................................................. H01M 2/02
[52] U.S. Cl. .............................. 429/93; 429/90; 429/91; 429/92; 324/435
[58] Field of Search .................................. 429/90, 91, 92, 429/93; 324/435

[56] References Cited

U.S. PATENT DOCUMENTS

| | | |
|---|---|---|
| 394,100 | 12/1888 | Currie . |
| 945,564 | 1/1910 | Marko . |
| 1,497,388 | 6/1924 | Sterling . |
| 2,980,754 | 4/1961 | Reilly et al. . |
| 2,988,590 | 6/1961 | André . |
| 3,280,701 | 10/1966 | Donnelly et al. . |

(List continued on next page.)

FOREIGN PATENT DOCUMENTS

| | | |
|---|---|---|
| 450938 | 4/1991 | European Pat. Off. . |
| 497616 | 1/1992 | European Pat. Off. . |
| 501609 | 1/1992 | European Pat. Off. . |
| 495636 | 7/1992 | European Pat. Off. . |
| 523901 | 7/1992 | European Pat. Off. . |
| 3150480 | 6/1983 | Germany . |
| 3738731 | 5/1988 | Germany . |
| 4106664 | 9/1992 | Germany . |
| 57-153275 | 9/1982 | Japan . |
| 56-156968 | 10/1983 | Japan . |
| 60-66170 | 4/1985 | Japan . |
| 60-066170 | 8/1985 | Japan . |
| 60-52189 | 11/1985 | Japan . |
| 63-179269 | 7/1988 | Japan . |
| 63-213256 | 9/1988 | Japan . |
| 2-41365 | 3/1990 | Japan . |

(List continued on next page.)

OTHER PUBLICATIONS

Carl M. Lampert et al., "Large–Area Chromogenics: Materials and Devices for Transmittance Control," *SPIE Institutes for Advanced Optical Technologies*, vol. IS 4, Sep. 1988.

Robert Parker, "Solid State RMS Recording Ammeter," Lawrence Livermore Laboratory, University of California, Jul. 1972.

BatCheck Advertisement/Instructions by Celgard, 13800 S. Lakes Drive, Charlotte, NC, Jun. 1988.

*Primary Examiner*—John S. Maples
*Attorney, Agent, or Firm*—Lee, Mann, Smith, McWilliams, Sweeney & Ohlson

[57] ABSTRACT

A method for producing a battery tester label is disclosed. The method includes forming an inserted tester device and a base layer, which are combined together to form the battery tester label. The resulting tester label can be applied to a battery. Also disclosed are methods for producing a plurality of battery tester labels disposed on a common releasable liner. The resulting array can be stored for subsequent application to batteries, cut into relatively long strips for rolling and storage, or immediately applied to batteries.

7 Claims, 5 Drawing Sheets

U.S. PATENT DOCUMENTS

| | | |
|---|---|---|
| 3,500,372 | 3/1970 | Thiele . |
| 3,514,338 | 5/1970 | Eekma . |
| 3,563,806 | 2/1971 | Hruden . |
| 3,667,039 | 5/1972 | Garfein et al. . |
| 3,720,869 | 3/1973 | Rowlette . |
| 3,764,893 | 10/1973 | Weigand . |
| 3,773,563 | 11/1973 | Eaton, Jr. et al. . |
| 3,823,367 | 7/1974 | Kaye et al. . |
| 4,006,414 | 2/1977 | Parker . |
| 4,027,231 | 5/1977 | Lohrmann . |
| 4,060,666 | 11/1977 | Anes . |
| 4,118,112 | 10/1978 | Thornburg . |
| 4,173,733 | 11/1979 | Sugalski et al. . |
| 4,198,597 | 4/1980 | Sawyer . |
| 4,248,942 | 2/1981 | Eby et al. . |
| 4,316,185 | 2/1982 | Watrous et al. . |
| 4,360,780 | 11/1982 | Skutch, Jr. . |
| 4,365,241 | 12/1982 | Morishita . |
| 4,371,827 | 2/1983 | Mullersman et al. . |
| 4,379,816 | 4/1983 | Mullersman et al. . |
| 4,392,102 | 7/1983 | Sugalski et al. . |
| 4,421,560 | 12/1983 | Kito et al. . |
| 4,432,041 | 2/1984 | Pfisterer et al. . |
| 4,497,881 | 2/1985 | Bertolino . |
| 4,520,353 | 5/1985 | McAuliffe . |
| 4,536,757 | 8/1985 | Ijntema . |
| 4,560,937 | 12/1985 | Finger . |
| 4,626,765 | 12/1986 | Tanaka . |
| 4,680,527 | 7/1987 | Benenati et al. . |
| 4,702,563 | 10/1987 | Parker . |
| 4,702,564 | 10/1987 | Parker . |
| 4,723,656 | 2/1988 | Kiernan et al. . |
| 4,726,661 | 2/1988 | Parker . |
| 4,727,006 | 2/1988 | Malinowski et al. . |
| 4,737,020 | 4/1988 | Parker . |
| 4,746,200 | 5/1988 | Kamigaki . |
| 4,801,514 | 1/1989 | Will et al. . |
| 4,835,475 | 5/1989 | Hanakura et al. . |
| 4,835,476 | 5/1989 | Kurosawa . |
| 4,876,632 | 10/1989 | Osterhout et al. . |
| 4,902,108 | 2/1990 | Byker . |
| 4,911,994 | 3/1990 | Will et al. . |
| 4,917,973 | 4/1990 | Yoshimoto et al. . |
| 5,015,544 | 5/1991 | Burroughs et al. . |
| 5,059,895 | 10/1991 | Cataldi et al. . |
| 5,128,616 | 7/1992 | Palmer . |
| 5,130,658 | 7/1992 | Bohmer . |
| 5,132,176 | 7/1992 | Valentine et al. . |
| 5,156,931 | 10/1992 | Burroughs et al. . |
| 5,188,231 | 2/1993 | Kivell et al. . |
| 5,223,003 | 6/1993 | Tucholski et al. . |
| 5,231,356 | 7/1993 | Parker . |
| 5,250,905 | 10/1993 | Kuo et al. . |
| 5,389,458 | 2/1995 | Weiss et al. . |
| 5,393,618 | 2/1995 | Weiss et al. . |
| 5,409,788 | 4/1995 | Weiss et al. . |
| 5,418,085 | 5/1995 | Huhndorff et al. . |
| 5,418,086 | 5/1995 | Bailey . |
| 5,458,992 | 10/1995 | Bailey . |
| 5,491,420 | 2/1996 | Parker . |
| 5,494,496 | 2/1996 | Huhndorff et al. . |
| 5,525,439 | 6/1996 | Huhndorff et al. . |
| 5,538,806 | 7/1996 | Weiss et al. . |
| 5,578,390 | 11/1996 | Hughen . |
| 5,604,049 | 2/1997 | Weiss et al. . |
| 5,607,790 | 3/1997 | Hughen et al. . |
| 5,612,151 | 3/1997 | Hughen . |
| 5,614,333 | 3/1997 | Hughen et al. . |
| 5,626,978 | 5/1997 | Weiss et al. . |
| 5,654,640 | 8/1997 | Bailey . |
| 5,667,538 | 9/1997 | Bailey . |
| 5,830,596 | 11/1998 | Weiss et al. ............................. 429/90 |

FOREIGN PATENT DOCUMENTS

| | | |
|---|---|---|
| 2100269 | 4/1990 | Japan . |
| 2184884 | 7/1990 | Japan . |
| 3-13379 | 1/1991 | Japan . |
| 3123384 | 5/1991 | Japan . |
| 4-329384 | 11/1992 | Japan . |
| 4-329385 | 11/1992 | Japan . |
| 8600282A | 9/1987 | Netherlands . |
| 1153226 | 5/1969 | United Kingdom . |
| 2011698 | 7/1979 | United Kingdom . |
| 2282697 | 4/1995 | United Kingdom . |
| 92 03852 | 3/1992 | WIPO . |
| 92 13368 | 8/1992 | WIPO . |
| 93 06474 | 4/1993 | WIPO . |

BATTERY TESTER LABEL FOR BATTERY

This is a continuation of application Ser. No. 08/634,071 filed on Apr. 17, 1996, now U.S. Pat. No. 5,830,596 which is a continuation-in-part of application Ser. No. 08/426,367 filed Apr. 21, 1995, now U.S. Pat. No. 5,626,978, which is a continuation of application Ser. No. 056,157 filed May 3, 1993, now U.S. Pat. No. 5,409,788; application Ser. No. 08/377,178 filed Jan. 24, 1995, now U.S. Pat. No. 5,538,806, which is a continuation of application Ser. No. 056,160 filed May 3, 1993, now U.S. Pat. No. 5,393,618; and application Ser. No. 08/377,352 filed Jan. 24, 1995, now U.S. Pat. No. 5,604,049, which is a continuation of application Ser. No. 056,158 filed May 3, 1993, now U.S. Pat. No. 5,389,458.

FIELD OF THE INVENTION

The present invention relates to a method for producing a battery tester label and the resulting label and battery assembly. The novel battery tester label is readily formed from two subcomponents which are easily manufactured and which can be stored for subsequent assembly of the tester label. The present invention also relates to processes for producing multiple battery tester labels disposed on a common releasable liner.

BACKGROUND OF THE INVENTION

Batteries are often stored before being used. Batteries are typically stored by retailers before being sold. After purchase by a consumer, such batteries are again typically stored for some period of time prior to use. If the period of storage is significant, batteries may self-discharge. Therefore, it is desirable to utilize a battery tester to determine if a battery has sufficient charge to operate a desired device.

It is also desirable, on frequent occasions, to determine the remaining life of batteries which are in use. Many "good" batteries are discarded simply because the user cannot recall how long they have been used in a particular device, i.e., a camera, tape deck, etc. For similar reasons, batteries often reach a useless or near useless state of discharge when no replacements are readily available. Separate or stand-alone battery testers are known which indicate remaining battery power. However, such testers are easily misplaced and cumbersome to use.

Battery testers have been described that are included in a label secured to a battery. However, such battery testers are intricate and difficult to manufacture, particularly at high rates necessary for large volume production. Thus, there is a need for a battery tester label having a minimal number of components and a process which can be employed in high rate commercial manufacturing operations.

Previously described battery tester labels, such as disclosed in U.S. Pat. No. 5,059,895 to Cataldi et al., require a complex arrangement of the conductive layer and additional conductors to electrically connect and disconnect the layer to and from the battery. Such intricate assemblies are susceptible to numerous problems during assembly and are costly in view of the additional conductive components necessary which must be formed and incorporated into the assembly. Thus, there is a need for a battery tester label which does not require numerous electrically conductive components to connect and disconnect the tester to the battery, and which can be easily and inexpensively manufactured.

In many large-scale manufacturing operations, it is desirable to utilize preassembled components. Such practice minimizes process complexity and as a result often reduces manufacturing downtime. Therefore, it is also desirable to provide a process for forming a battery tester label in which one or more subcomponents of the label assembly can be manufactured, stored and later readily assembled into a tester label. In particular, it is desirable to provide a process for forming a plurality of battery testers which can be easily stored or applied to batteries. The present invention process and resulting assembly, as described and claimed herein, achieve all of the foregoing objectives.

SUMMARY OF THE INVENTION

The present invention provides a method for producing a battery tester label comprising a tester device and a base layer. The process comprises providing a tester device including a conductive circuit defining switch segments on one face of a dielectric substrate and an indicator layer disposed on the other face; providing a base layer comprising a dielectric substrate and thermal insulation disposed on one face of the substrate; forming first and second apertures in the base layer, with at least one raised switch throw pad at one of the apertures; orienting the tester device with the base layer such that the conductive circuit faces the thermal insulation and the switch segments directly overlie the apertures formed in the base layer; and affixing the tester device to the base layer to thereby form the battery tester label of the present invention. The invention also provides the resulting battery tester label, and when applied to a battery, the resulting battery and label assembly. Also provided is a method for producing a plurality of battery tester labels disposed on a common releasable liner. The array of resulting tester labels can be immediately applied to batteries or stored on the liner for shipment or subsequent use.

DESCRIPTION OF THE PREFERRED EMBODIMENTS

Figure 1:
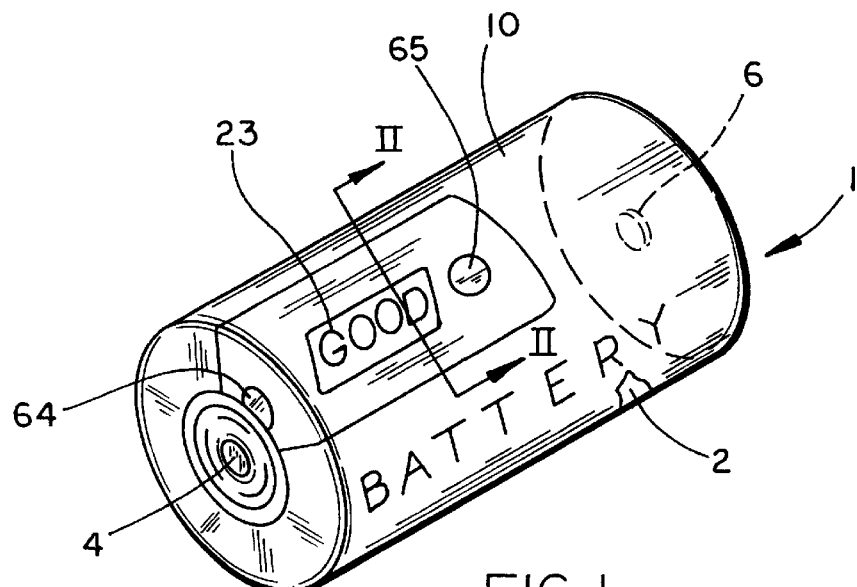
FIG. 1 is an illustration of a battery having a battery tester label in accordance with this invention disposed about the outer periphery of the battery.

The present invention provides a method for preparing a battery tester label and attaching the resulting label to a battery. The preferred embodiment method generally comprises forming two subcomponents, an inserted tester device and a base layer, and combining the inserted tester device with the base layer to produce the battery tester label of the present invention. The resulting label can then be applied to a battery or stored for later attachment, FIG. 1 illustrates a battery and label assembly 1 comprising a battery can 2, a negative terminal 4, and a positive terminal 6. Can 2 may be in electrical contact with positive terminal 6. Extending around and attached to the periphery of can 2 is the battery tester label 10 which is the subject of this invention comprising switches 64 and 65 which activate .X the tester incorporated within label 10 to indicate the state of charge of the battery by exposing indicia 23 or producing some other visual indication.

Figure 5:
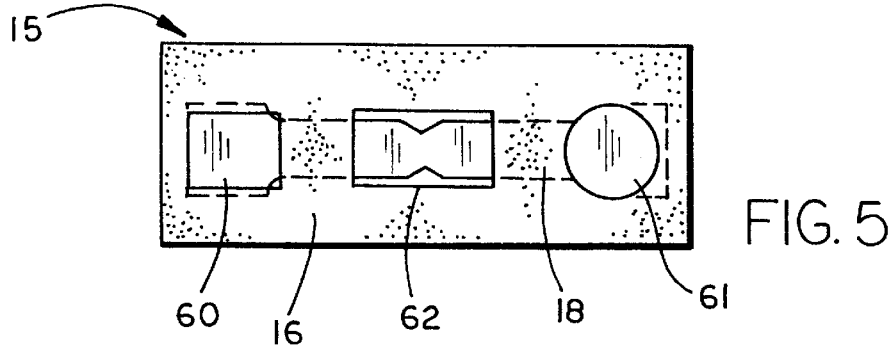
FIG. 5 is a bottom plan view of the inserted tester device, the cross-hatching indicating a layer of adhesive.

The first subcomponent of the preferred embodiment label 10 is an inserted tester device 15, best illustrated in FIGS. 2–5. Tester device 15 generally comprises a laminate or layered assembly having a substrate layer 20, an elongated electrically conductive circuit 18 disposed on a first face of substrate 20, a pressure-sensitive adhesive 16 disposed on portions of both conductive circuit 18 and the first face of substrate 20. Adhesive 16, indicated by cross-hatching in FIG. 5, is preferably applied over conductive layer 18 in the pattern illustrated. It is omitted from those areas which will overlie printed insulation 44 and switch pads 42 when the inserted tester 15 is affixed to base layer 30. This adhesive pattern retards moisture from migrating to the switch pad areas 60 and 61 while not interfering with the function of either the pads or the insulation to be discussed.

Device 15 further comprises one or more graphic layers 22, preferably of decorative ink, and indicia 23 that are disposed on a second face of substrate 20 opposite the face containing the conductive circuit 18. Device 15 also comprises a layer of an indicator material 24 that is deposited upon the second face, preferably upon graphic layers 22 and indicia 23. As described in greater detail below, the indicator material preferably comprises a temperature sensitive indicating material. A layer of a clear protective coating (not shown) is preferably deposited over the indicator layer and optionally upon graphic layers 22 and other exposed regions of the second face of substrate 20.

Figure 2:
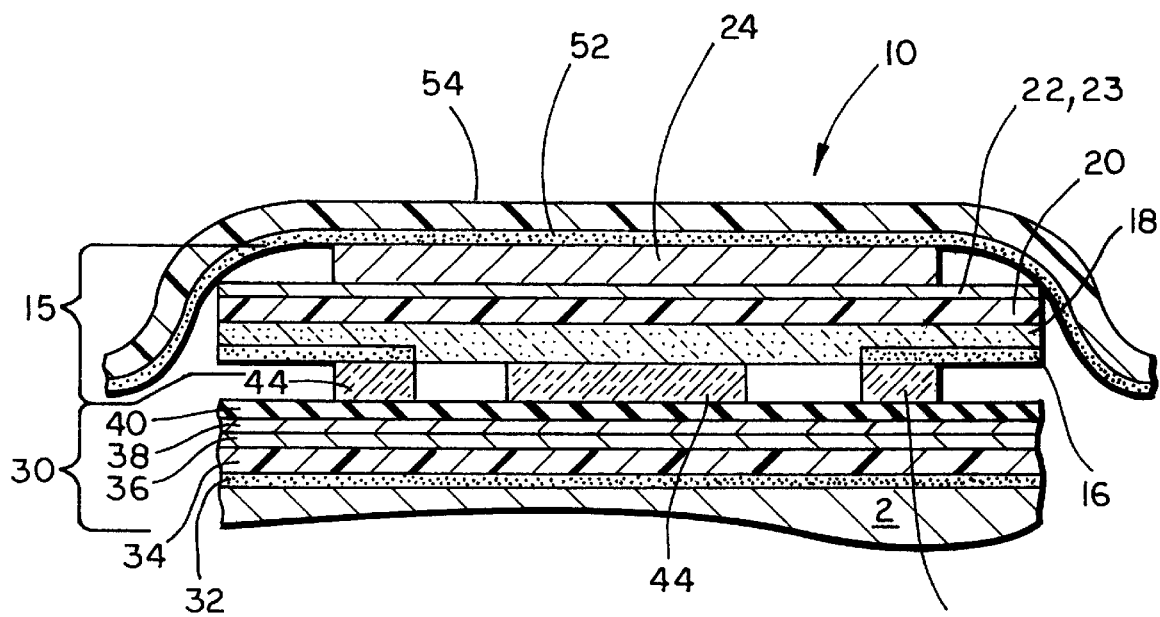
FIG. 2 is a cross section of the battery tester label taken along plane II—II of FIG. 1.
Figure 3:
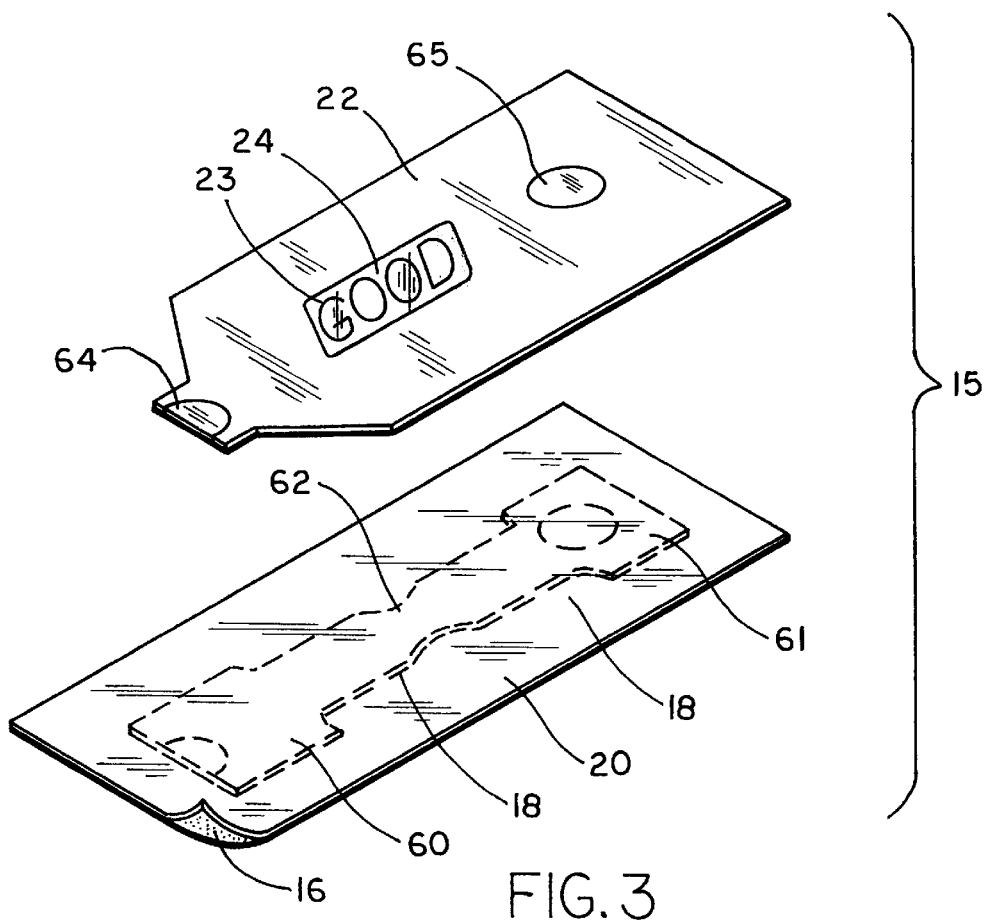
FIG. 3 is an exploded view of a subcomponent of the battery tester label, referred to herein as the inserted tester device.
Figure 4:
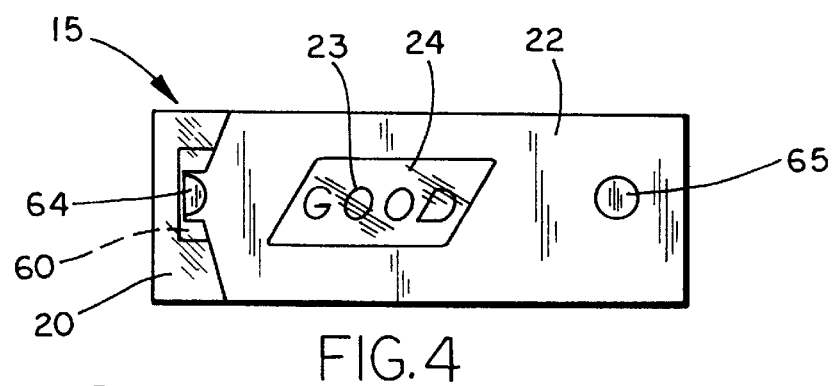
FIG. 4 is a top plan view of the inserted tester device.

The inserted tester device 15, as shown in FIGS. 2–5 and 8, is preferably prepared as follows. A plastic film is provided for substrate 20. Although FIG. 3 illustrates substrate 20 as being transparent, substrate 20 could be formed from a wide variety of other materials including opaque and translucent materials. Conductive circuit 18 is deposited on one face of substrate 20. The conductive circuit is preferably deposited in the form of a pattern comprising two distal regions for forming switches, referred to and illustrated herein as switch segments 60 and 61, and a medially disposed area of controlled resistivity 62 which undergoes an increase in temperature upon passage of electrical current. A pressure-sensitive adhesive material 16 is deposited on at least portions of either or both the conductive circuit 18 and substrate 20 face. As previously noted, particular regions of conductive circuit 18 are left exposed and not covered with pressure-sensitive adhesive 16; namely, the switch segments 60 and 61 and area of controlled resistivity 62. A silicone coated release liner, such as a silicone coated paper or plastic film (not shown), is applied onto the previously deposited pressure-sensitive adhesive 16 to facilitate handling and/or storage of inserted tester device 15.

Graphics and/or other labeling colors 22 in the form of a layer or layers of decorative ink and indicia 23 are printed to the opposite side of substrate 20 from that on which the conductive circuit 18 is positioned. It is preferred that indicia 23 be disposed directly above the area of controlled resistivity 62 of conductive circuit 18 located on the other side of substrate 20. Additional graphics are also preferably printed to designate switch regions 64 and 65. If necessary, one or more curing operations may be performed to cure or partially cure the graphic or coloring layers.

On the same side of the substrate as the graphics and/or labeling colors, a thermochromic ink or other indicator material 24 is deposited onto substrate 20 such that it is situated directly above the area of controlled resistivity 62 of conductive circuit 18 and preferably over indicia 23. A clear protective coating, such as a varnish film, is then applied over and onto the indicator material, and optionally over the remaining regions of this side of substrate 20 to protect such regions from damage by subsequent manufacturing or storage operations. Each of the previously described layers or elements preferably have a thickness of from about 0.00005 inch to about 0.005 inch. The inserted tester device, if necessary, can be cut to an appropriate size.

Figure 6:
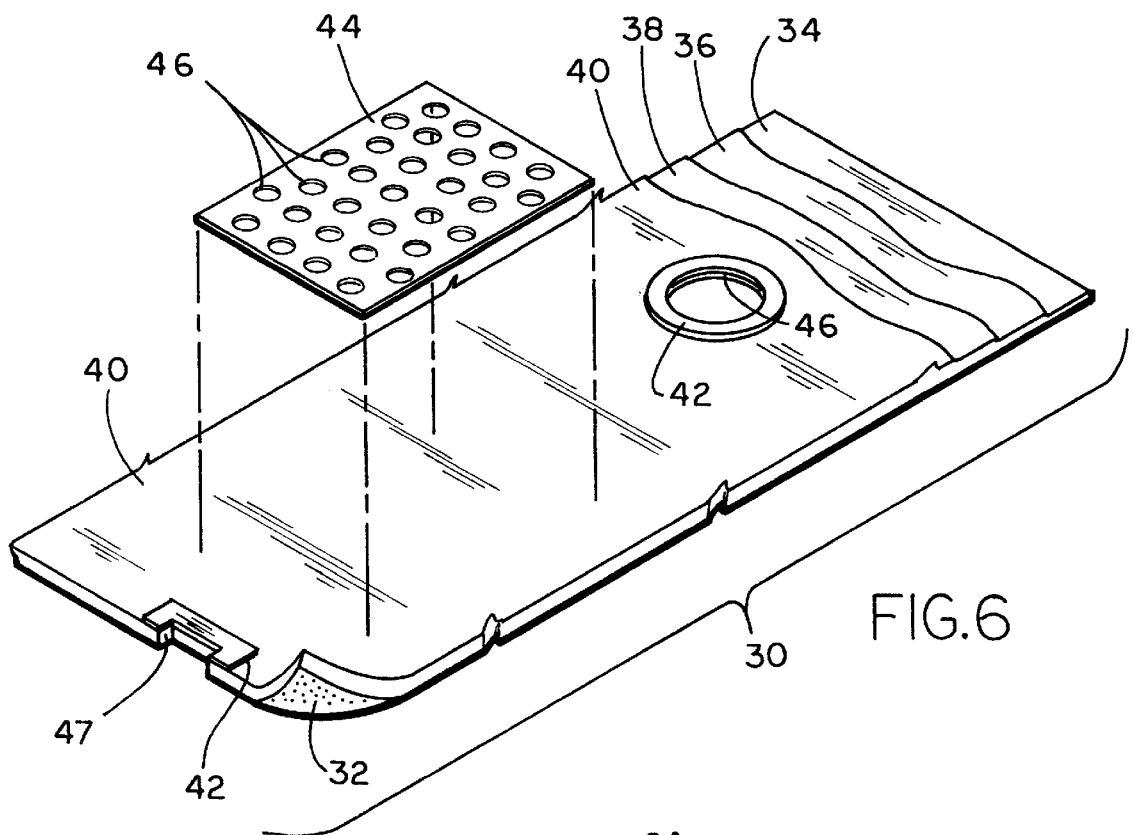
FIG. 6 is an exploded view of another subcomponent of the battery tester label, referred to herein as the base layer.

The second subcomponent of the preferred embodiment label 10 is a base layer 30, best illustrated in FIGS. 2 and 6. Base layer 30 is a laminate or layered structure comprising a substrate 34, with one face having a layer of pressure-sensitive adhesive 32 for subsequent contact with a battery, and another face having one or more layers as follows: a metallization layer 36; a primer and/or decorative layer 38; an electrical insulation layer 40; and a thermal insulation layer 44. Also residing proximate to the thermal insulation layer are one or more switch throw pads 42 described in greater detail below.

Base layer 30 is prepared as follows. A plastic film is provided for the base layer substrate 34. A pressure-sensitive adhesive material 32 is deposited upon the face of the base layer substrate 34 that will subsequently face and contact the battery. A silicone release liner is applied on the pressure-sensitive adhesive to facilitate handling and other processing operations. On the opposite face of base layer substrate 34, one or more graphic or labeling color layers are deposited, for instance, by printing. Preferably, a metallization layer 36 is utilized to provide a decorative reflective layer. If a metallization layer is deposited, it will in most instances be necessary to deposit a receptive coating or primer layer 38 onto those regions of metallization layer 36 upon which other decorative layers are to be deposited. Primer layer 38 may in itself be a decorative layer. It is also desirable to deposit a layer of electrical insulation 40 upon metallization layer 36 and/or primer layer 38 to prevent electrical contact, i.e., shorting, between layer 36 and the conductive circuit 18 of inserted tester device 15 upon assembly of tester label 10.

Thermal insulation 44 is positioned in an area of base layer substrate 34 that will be disposed beneath the indicator material 24 and the maximum resistance area 62 of conductive circuit 18 of the previously described inserted tester device. This thermal insulation reduces heat transfer from the area of controlled resistivity 62 of conductive circuit 18 to the battery. If such heat transfer is not controlled and the battery is permitted to act as a heat sink, the change in temperature at indicator material 24 may be insufficient to provide an accurate indication of the battery state of charge.

Thermal insulation 44, as shown, comprises a plurality of apertures 46 which, when assembled into the laminate structure of the preferred label 10, provide air pockets which further thermally insulate the conductive circuit 18 from the battery. Optionally, a larger region of air space or void may be formed to serve as insulation by depositing a suitable spacer material onto the base layer 30. The preferred insulative pattern is a series of islands printed onto layer 30 in the manner shown in FIG. 1-A of aforenoted U.S. Pat. No. 5,389,458.

Figure 8:
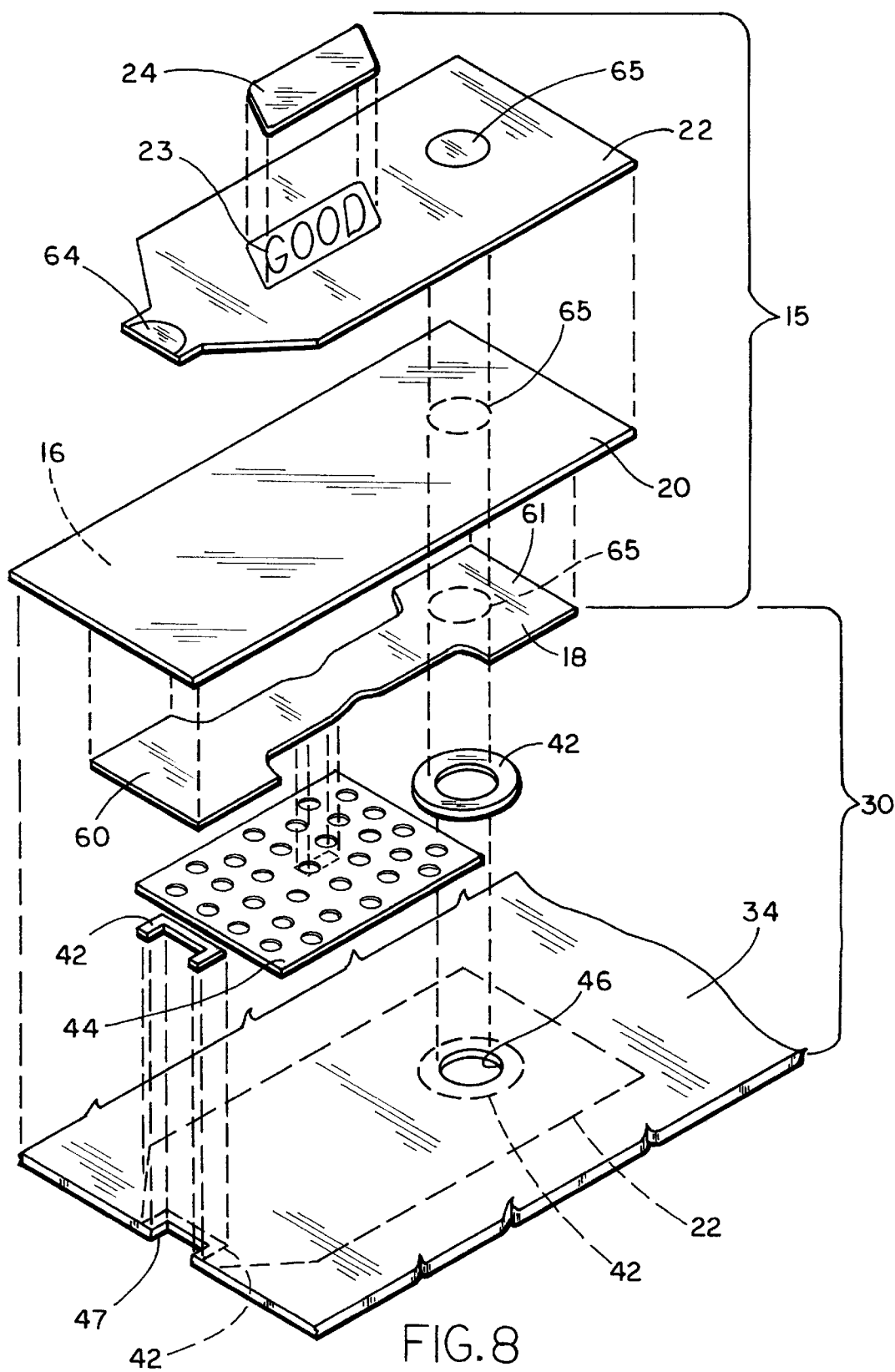
FIG. 8 is an exploded view of the battery tester label.

A switch throw pad 42 is also formed surrounding aperture 46. This raised pad provides spacing between switch segment 61 of the conductive circuit 18 and battery can 2, and significantly minimizes the occurrence of accidental switch closure. Raised switch throw pad 42 is preferably formed by depositing or printing a dielectric ink or other suitable material. A second switch pad 42 may be formed proximate aperture 47 as shown in FIGS. 6 and 8. This pad has not been found necessary to proper functioning of the tester.

In all of the foregoing operations, one or more cure steps may be utilized when depositing or printing any of the previously described layers, particularly the decorative inks. Each of the previously described layers or elements preferably has a thickness from about 0.00005 inch to about 0.005 inch.

Switch apertures 46 and 47 are preferably formed in base layer 30 after printing thermal insulation 44 and switch throw pad 42. Such apertures are preferably formed by suitable punching operations. Registry problems are minimized by printing what is to become switch pad 42 as a solid disk and thereafter punching aperture 46 centrally of this disk. Switch apertures are formed in the base layer 30 so that when the previously described inserted tester device 15 is combined with base layer 30, the switch apertures are located directly beneath the distal switch segments 60 and 61 of conductive circuit 18. The preferred geometry for such switch apertures is a notch 47 for the negative switch segment 64 and a circle 46 for the positive switch segment 65.

The switches utilized in the battery tester label are preferably membrane switches such that a switch segment 60 or 61 of conductive circuit 18 overlies an aperture in the base layer. The aperture in the base layer enables contact between the conductive circuit and a battery terminal on the other side of the base layer. Upon application of a force to a switch segment, such as by applying finger or thumb pressure at 64 or 65, a portion of the switch segment is pressed or deformed through the opening in the base layer to contact the battery terminal. Upon release of the pressure, the portion of the switch segment resiliently "springs" away from and, thus, out of electrical contact with the battery terminal. This configuration is referred to herein as "switchably connected."

A significant advantage provided by the present invention battery tester label is the absence of electrically conductive layers or members to electrically connect and disconnect the tester, i.e., conductive circuit 18, to and from the battery. This is remarkable and of significant benefit particularly when manufacturing a battery tester label in large volumes and at a high rate. This advantage of eliminating otherwise necessary electrically conductive switching components is achieved in part by providing a first switch 64 which is disposed very near a battery terminal, such as negative terminal 4. Such close proximity eliminates the need for additional conductive elements to electrically connect an end of circuit 18 to the negative battery terminal. It is most preferred to fold or shrink the peripheral edge of label 10 over the battery end at which the negative terminal is disposed, as illustrated in FIG. 1. This configuration eliminates the need for a conductive "tab" or member extending outward from the battery, as described in the prior art.

The inserted tester device 15 is combined with the base layer 30 as follows and as best shown in FIG. 8. The inserted tester device is positioned onto or adjacent the base layer so that switch segments 60 and 61 of conductive circuit 18 overlie switch apertures 46 and 47, respectively. The inserted tester device is oriented such that the layer of pressure-sensitive adhesive 16 (the release liner having been removed if previously applied) is facing base layer 30. Upon application of sufficient pressure to the inserted tester device 15 and base layer 30, the two assemblies are securely attached to each other via adhesive 16, and form the preferred battery tester label 10 of the present invention. Optionally, a clear laminating adhesive 52 is deposited upon the outward facing surface of the resulting tester label as illustrated in FIG. 2, and a clear film 54, such as polyvinyl chloride or polyester, is applied over the coating and the resulting assembly cured. A coating of adhesive 52 and film 54, when applied onto the tester label, provide protection for the tester device and components thereof. It is most preferred that the transparent protective layer resulting from adhesive coating 52 and film 54 is deposited upon the battery tester label prior to application of the tester label to a battery.

The resulting battery tester label 10 is appropriately die cut to the size of the battery desired. Upon removal of excess trimmed label, a plurality of individual tester labels are left remaining on the release liner previously applied to substrate 34 of base layer 30. The liner and label array may then be cut into strips and wound into a roll and stored for subsequent application to batteries.

The substrate layer utilized for either or both the base layer substrate 34 and the inserted tester device substrate 20 can be made of any desired dielectric polymer material. It is preferable to use a dielectric polymer material that will shrink when assembled on a battery. Generally, polyvinyl resins, polyolefin resins, polyester resins and the like would be suitable. Specific examples include polyvinyl chloride, polyethylene and polypropylene. It is contemplated that substrate 20 could also be formed from other dielectric materials besides plastics such as paper or other cellulose-based materials. The thickness of the substrate layers is not particularly limited, but is preferably in the range of from about 0.0005 to about 0.005 inch, and most preferably from about 0.001 to about 0.003 inch.

The electrically conductive circuit 18 of the inserted tester device 15 can be a metallic foil, such as silver, nickel, iron, copper, lead, etc., and mixtures thereof, or a metallized plastic layer. The conductive circuit is preferably formed from a silver-based material. Other examples include electrically conductive polymers, paints or inks, such as those that contain graphite, carbon or metal, such as silver or combinations thereof, which can be applied onto a substrate as a conductive layer. Hot stamping of conductive material onto the substrate could also be used. Preferably, conductive circuit 18 is formed as a separate part, most preferably on dielectric substrate 20 and shaped to have first and second switch segments 60 and 61 that are connected to each other via the area of controlled resistivity 62. The resistance in the area of controlled resistivity 62 can vary, to provide a qualitative measure of the remaining battery strength, or it can be constant depending upon the particular application. In the preferred embodiment illustrated, it is generally constant, providing for a "good-bad" indication of remaining battery strength.

The previously described indicator layer 24 in the inserted tester device 15 comprises a thermally sensitive material for indicating the capacity of the battery. The preferred thermally sensitive materials change color in response to a temperature change, which change is readily viewable by a consumer. Thus, the consumer, based on the color change, can determine whether the battery is good or needs to be replaced. Examples of such thermally sensitive materials include liquid crystal materials and thermochromic inks. Examples of suitable liquid crystal materials are of the cholesteric type, such as cholesteryl oleate, cholesteryl chloride, cholesteryl caprylate and the like. The indicator material could change from colored to colorless, colorless to colored, or from one color to a second color. A tri-color material could also be used. The preferred battery tester 10 shown in FIGS. 1–8 utilizes an indicating material which changes from colored to colorless upon activation to reveal indicia 23 underneath the indicator material 24.

Indicating materials, such as thermochromic inks, can be used singly or in combination. For example, in one embodiment different layers of the indicating material are employed. The layers are activated at different temperatures or states and can be designed to change different colors at different temperatures. For example, the layer of indicating material activated at the highest temperature will preferably be the bottom layer, i.e., closest to the battery, and the outer layers are arranged in decreasing temperatures of activation with lowest temperature material in the outermost layer, and so, readily viewable at the exterior of the battery.

Either one or both switch segments 60 and 61 of conductive circuit 18 can be out of contact with the respective terminals of the battery so that the tester circuit is open. In one embodiment of the invention, one of the switch segment ends is permanently in electrical connection with one terminal of the battery, while the other switch segment end is positioned out of contact with the other battery terminal. By forcing the switch segment end into contact with the other battery terminal, the switch is closed and the tester circuit is completed to test the battery. The most preferred embodiment is to utilize a dual switch tester as shown in the accompanying drawings.

The labels useful in this invention can also comprise additional electrical and thermal insulative layers, printing layers, protective layers and the like. Suitable materials for use as the different layers are those typically used in battery labels and include plasticized or unplasticized polyvinyl chloride (UPVC), polyesters, metallic films, paper and like. The tester label can be in the form of a shrinkable tube label in which a battery is encased.

Figure 7:
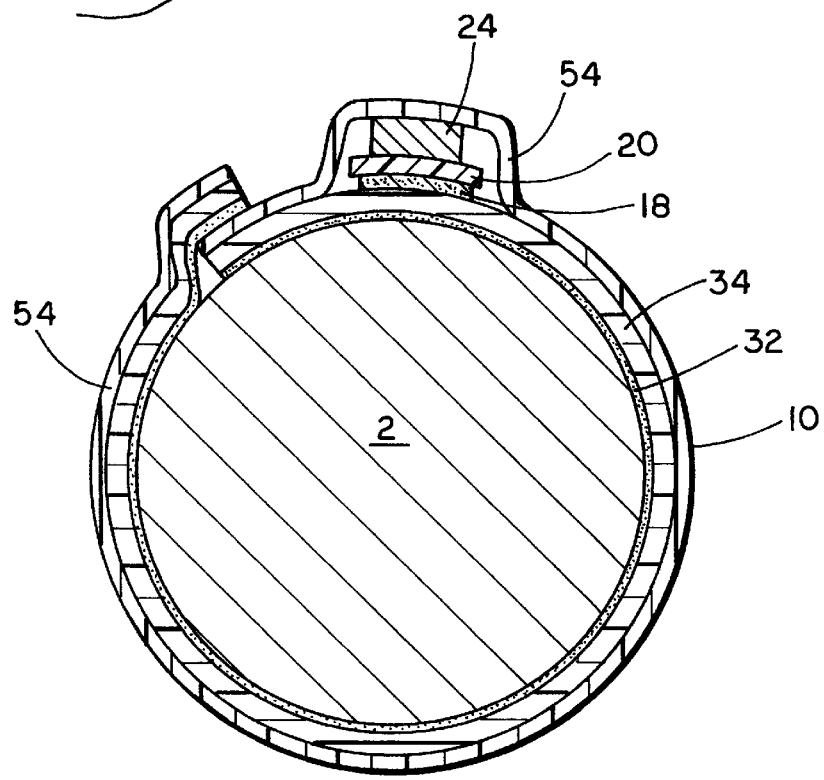
FIG. 7 is a cross section of a battery and the battery tester label.

The battery tester label of the present invention is preferably applied to a battery as follows. A previously assembled inserted tester device 15, having its underside containing pressure-sensitive adhesive 16 exposed, is aligned with a previously formed base layer 30 (disposed upon a releasable liner) such that the electrically conductive circuit 18 of the inserted tester device is positioned to contact the thermal insulation 44 of base layer 30. Upon application of sufficient pressure, the respective layers are secured and joined to one another via pressure-sensitive adhesive 16 disposed on the mating surface of inserted tester device 15. The resulting battery tester label 10 is then attached to the outer periphery of a battery can 2 by removing the liner of base layer 30 to expose adhesive 32 on the underside of label 10 and contacting the underside of base layer 30 to the battery can 2. FIG. 7, not to scale, illustrates a typical cross section of the battery and label assembly 1. It is also possible to produce the tester label of the present invention and apply such to a battery without using preassembled tester device and/or base layer subcomponents. In another embodiment, the battery and tester label assembly is formed by combining the inserted tester device 15 and base layer 30 as previously described. The resulting label is then itself stored, such as on a releasable liner in a wound roll, until needed.

The present invention also enables the production of multiple tester label assemblies. That is, a plurality of tester devices 15 can be aligned and mated with a plurality of base layer components, i.e., regions of thermal insulation, switch throw pads, and switch apertures, disposed upon and defined within a common base layer to form a plurality of battery tester labels 10. The resulting set of multiple label assemblies can then be stored for subsequent use, or separated into smaller groups of multiple label assemblies or into individual battery tester labels.

Figure 9:
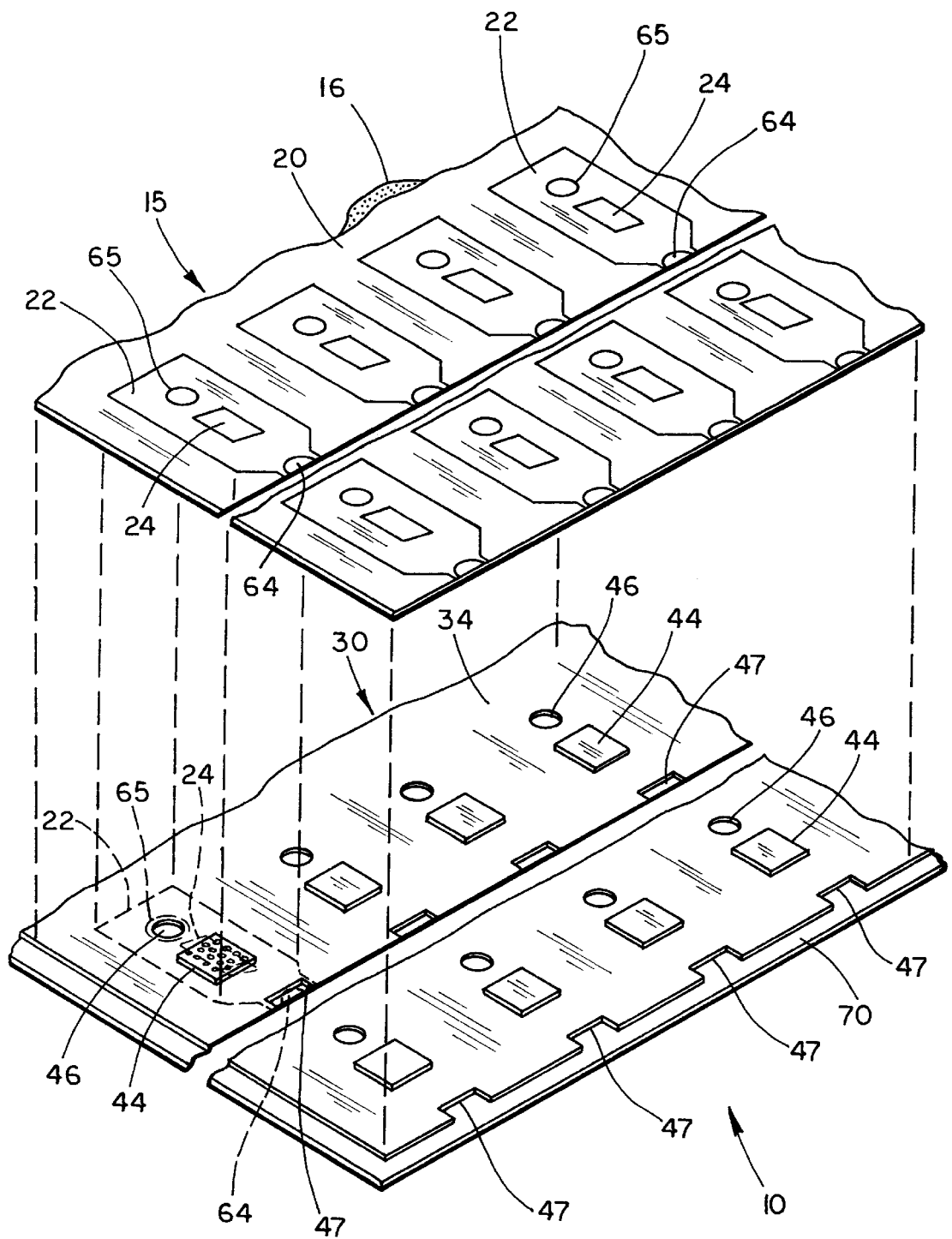
FIG. 9 is an exploded view of a plurality of battery tester labels disposed on a common releasable liner.

In the most preferred embodiment, a series of battery tester labels 10, as illustrated in FIG. 9, are formed on a common releasable liner 70 for subsequent application to batteries. In this most preferred process, an array of tester devices 15 is provided, each tester device formed as previously described and disposed upon a common releasable liner (not shown). A base layer 30 is provided comprising a dielectric substrate 34, a liner 70 that is releasably secured to the underside of the substrate such as by previously noted pressure-sensitive adhesives, and a plurality of regions of thermal insulation 44 disposed on substrate 34. A plurality of apertures 46 and 47 are formed in the base layer through preprinted switch pad 42, in the case of aperture 46. The arrays of base layers and tester devices are then slit into serial rolls. Upon removal of the releasable liner from the serial roll of tester devices, thereby exposing adhesive 16 on the underside of substrate 20, the tester devices 15 are oriented with base layer 30 such that each conductive circuit (not shown) of the tester device roll faces a corresponding region of thermal insulation 44 of the base layer 30, and so that the switch segments of each conductive circuit directly overlie a corresponding pair of apertures 46 and 47 formed in the base layer. The roll of tester devices is then affixed or otherwise secured to the base layer, for instance by adhesive 16, to form a roll of battery tester labels 10 disposed on the common releasable liner 70 residing underneath the base layer.

It is then most preferred to apply a layer of a transparent adhesive and clear film, such as 52 and 54 illustrated in FIG. 2, upon the exposed face of the array of tester devices 15. Upon sufficient curing, if necessary, the resulting coated assembly is die cut so that each individual battery tester label disposed on releasable liner 70 is correctly sized for the battery to receive the tester label. Die cutting is performed so that releasable liner 70 is not cut, so that the tester labels 10 remain on a common sheet to facilitate handling and storage. The excess trimmed label, referred to as the matrix, is then removed.

The present inventors have discovered that methods of the present invention in which two subcomponents are each separately formed and then mated with one another overcome numerous problems otherwise encountered if attempts were made to manufacture a battery tester label in a continuous layering technique, i.e., where each layer is deposited upon the layer before it in a step-wise fashion. For example, the techniques of the present invention avoid problems resulting from material processing mismatches such as the effect of curing a decorative ink layer upon a previously deposited adhesive layer. Additionally, the techniques of the present invention avoid many configurational or structural problems that can occur when depositing material layers or coatings upon previously applied viscous or flowable layers such as some adhesives.

Other assembly variations and materials are disclosed in U.S. Pat. No. 5,409,788; 5,393,618; and 5,389,458, each of which is herein incorporated by reference. Additional processing and structural variations are set forth in U.S. Pat. No. 5,223,003, which is herein incorporated by reference.

Of course, it is understood that the foregoing are merely preferred embodiments of the present invention and that various changes and alterations can be made without departing from the spirit and broader aspects thereof as set forth in the appended claims, which are to be interpreted in accordance with the principles of patent law including the doctrine of equivalents.

The embodiments of the invention in which an exclusive property or privilege is claimed are defined as follows:

1. A battery tester label for an electrochemical cell having a housing, said battery tester label comprising:
   a label substrate;
   a conductive circuit attached on said label substrate, said conductive circuit including first and second switch segments, said first switch segment adapted to be placed in electrical contact with a negative terminal and said second switch segment adapted to be placed in electrical contact with a positive terminal to generate an amount of heat related to the remaining capacity of the electrochemical cell;
   a thermochromic material applied over said conductive circuit and responsive to the heat generated by said conductive circuit for changing visual states to provide an indication of the remaining capacity of the electrochemical cell; and
   an insulating layer disposed between said conductive circuit and the housing of the electrochemical cell, said insulating layer defining a plurality of cavities extending through the thickness thereof to form thermally insulating air pockets between said conductive circuit and the housing of the electrochemical cell.

2. The battery tester label as defined in claim 1, wherein at least one of said cavities underlies one of the switch segments of said conductive circuit such that, when pressure is applied to said one switch segment of said conductive circuit, said one switch segment contacts the housing of the electrochemical cell thereby activating the battery tester.

3. The battery tester label as defined in claim 1, wherein said insulating layer is disposed between said label substrate and said conductive circuit.

4. A battery having a negative terminal and a positive terminal comprising:
   an electrochemical cell contained within a housing; and a battery tester label comprising:
   a label substrate;
   a conductive circuit attached on said label substrate, said conductive circuit including first and second switch segments, said first switch segment adapted to be placed in electrical contact with the negative terminal and said second switch segment adapted to be placed in electrical contact with the positive terminal to generate an amount of heat related to the remaining capacity of the electrochemical cell;
   a thermochromic material applied over said conductive circuit and responsive to the heat generated by said conductive circuit for changing visual states to provide an indication of the remaining capacity of said electrochemical cell; and
   an insulating layer disposed between said conductive circuit and said housing of said electrochemical cell, said insulating layer defining a plurality of cavities extending through the thickness thereof to form thermally insulating air pockets between said conductive circuit and said housing of said electrochemical cell.

5. The battery as defined in claim 4, wherein at least one of said cavities underlies one of the switch segments of said conductive circuit such that, when pressure is applied to said one switch segment of said conductive circuit, said one switch segment contacts said housing of said electrochemical cell thereby activating the battery tester.

6. The battery as defined in claim 4, wherein said insulating layer is disposed between said label substrate and said conductive circuit.

7. The battery as defined in claim 4, wherein said second switch segment is permanently in electrical contact with the positive terminal.

* * * * *